United States Patent [19]
Broer et al.

[11] Patent Number: 5,928,801
[45] Date of Patent: *Jul. 27, 1999

[54] ELECTROLUMINESCENT ILLUMINATION SYSTEM

[75] Inventors: Dirk J. Broer, Eindhoven, Netherlands; David B. Braun, San Luis Obispo, Calif.; Antonius H.J. Venhuizen; Christianne R.M. De Witz, both of Eindhoven, Netherlands

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/718,793
[22] Filed: Sep. 24, 1996

[30] Foreign Application Priority Data

Sep. 25, 1995 [EP] European Pat. Off. .............. 95202571

[51] Int. Cl.⁶ .................................................. H05B 33/00
[52] U.S. Cl. .......................... 428/690; 428/917; 349/69; 353/20; 359/494; 359/497; 359/500
[58] Field of Search ..................... 428/690, 917; 349/69; 353/20; 359/494, 497, 500

[56] References Cited

U.S. PATENT DOCUMENTS

| | | | |
|---|---|---|---|
| 4,772,885 | 9/1988 | Uehara et al. | 340/784 |
| 5,115,329 | 5/1992 | Ikarashi et al. | 359/50 |
| 5,217,794 | 6/1993 | Schrenk | 428/220 |
| 5,506,704 | 4/1996 | Broer et al. | 359/63 |
| 5,626,408 | 5/1997 | Heynderickx et al. | 353/20 |

FOREIGN PATENT DOCUMENTS

| | | |
|---|---|---|
| 0606939 | 7/1994 | European Pat. Off. . |
| 0606940A2 | 7/1994 | European Pat. Off. . |
| WO9216023 | 9/1992 | WIPO . |

OTHER PUBLICATIONS

"Polymer LEDs" by R. Friend et al. in Physics World, Nov. 1992, pp. 42–46.

"Retardation Film for STN–LCD's 'NRF'" of the Firm of Nitto Denko in SID '92 Exhibit Guide, Society for Information Display, May 17–2, 1992, Boston, MA, USA.

"Polarizing Color Filters Made From Cholesteric LC Silicones" by R. Maurer et al. in SID International Symposium May 1990, Digest of Technical Papers, pp. 110–113.

*Primary Examiner*—Charles Nold
*Attorney, Agent, or Firm*—Steven R. Biren

[57] ABSTRACT

An illumination system has an active layer which includes an electroluminescent material, the active layer being located between an optically transparent electrode layer and a reflective electrode layer. A reflective polarizer is present at a side of the transparent electrode layer facing away from the active layer. A sub-beam incident on the polarizer and having an unwanted polarization is reflected back to the active layer, where it is again partially depolarized to recover a component having the desired state of polarization. The invention also relates to a flat-panel picture display device which includes such an illumination system.

15 Claims, 1 Drawing Sheet

ELECTROLUMINESCENT ILLUMINATION SYSTEM

BACKGROUND OF THE INVENTION

The invention relates to an illumination system having an active layer which comprises an electroluminescent material and is present between an optically transparent electrode layer and a reflective electrode layer.

The invention also relates to a flat-panel picture display device comprising such an illumination system.

An illumination system of the type described in the opening paragraph is known from, for example, the article: "Polymer LEDs" by R. Friend, D. Bradley and A. Holmes in Physics World, November 1992, pp. 42–46. The illumination system described in this article comprises a semiconductor polymer film as an active layer which is formed on a first electrode layer which, in its turn, is provided on a glass substrate. A second electrode layer is provided on the polymer film. One of the two electrode layers should be optically transparent so as to pass light in a direction perpendicular to the plane of the illumination system. If a voltage is applied across the two electrode layers, the active layer emits light in accordance with the process of electroluminescence. The active layer and the two electrode layers jointly constitute a planar light-emitting diode (LED). Such an illumination system is particularly suitable for use as, for example, background lighting for a picture display device having a liquid crystalline picture display panel.

In a large number of flat-panel picture display devices comprising a liquid crystalline picture display panel, for generating the picture to be displayed the state of polarization of the light incident on the picture display panel is modulated in conformity with the picture information. To this end, the light incident on the picture display panel is preferably polarized in advance, which means that the illumination system must supply polarized light. To be able to realize this, for example, a dichroic polarizer may be arranged on the surface of the illumination system facing the picture display panel. A drawback is, however, that approximately 50% of the light supplied by the illumination system is absorbed by this polarizer and, consequently, will not contribute to the light output of the illumination system.

Another possibility of having the illumination system supply polarized light is to ensure that the active layer of the planar LED emits polarized light itself. An example of such a LED is described in the international Patent Application WO 92/16023. A drawback is the relatively low polarization efficiency, so that a considerable part of the emitted light does not have the suitable state of polarization to be modulated, so that it will not contribute to the formation of the picture.

SUMMARY OF THE INVENTION

It is an object of the invention to provide an electroluminescent illumination system in which substantially all the light emitted by the active layer has the same state of polarization when it is coupled out of the illumination system, which state of polarization is suitable to be modulated with picture information by a liquid crystalline picture display panel. In this way, the light output of light usable for the formation of the picture is enhanced considerably. It is possible to give such an illumination system a very flat shape.

To this end, the illumination system according to the invention is characterized in that a reflective polarizer is present at a side of the transparent electrode layer facing away from the active layer.

When a voltage is applied across the electrode layers, one electrode layer, namely the cathode, will inject electrons into the active layer, while the other electrode layer, the anode, will inject holes in this layer. These holes and electrons recombine in the active layer, resulting in energy being released so that the molecules of the active layer reach a higher energy level. When a molecule falls back to its basic state, this energy is released as light. The light may be coupled out of the planar LED via the transparent electrode layer.

By providing a reflective polarizer on the transparent electrode layer, the light which is passed by the electrode layer and which will generally be unpolarized will be split up into two beam components having complementary states of polarization. If the polarizer is a circular polarizer, an unpolarized beam will be split up into a levorotatory circularly polarized beam component and a dextrorotatory circularly polarized beam component. If the polarizer is linear, the two beam components will have mutually perpendicular linear polarization directions.

One beam component will be passed by the reflective polarizer and coupled out of the illumination system, whereas the other beam component will be reflected back into the illumination system in which it will again have a chance of being converted into light having the desired state of polarization as a result of depolarization in the active layer and one or more reflections on the reflective electrode layer.

When used in a flat-panel picture display device, the reflective polarizer is preferably adapted in such a way that the state of polarization for which the polarizer is transmissive is the suitable state of polarization for the liquid crystalline picture display panel. This state of polarization will be further referred to as the desired state of polarization.

The beam component reflected by the polarizer, in other words, the unwanted beam component, passes through the transparent electrode layer and the active layer towards the reflective electrode layer. Upon passage through the active layer, this beam component will at least partly depolarize as a result of the birefringence of this layer. In spite of the small thickness of the active layer, this layer, for example, in the case of a polymer LED, has a depolarizing effect for light at a grazing incidence because it holds for the refractive indices that $n_x = n_y > n_z$, in which z is the direction perpendicular to the plane of the active layer (x, y plane). Due to depolarization, the unwanted beam component falls apart in a sub-beam component having the desired state of polarization and a sub-beam component having the unwanted state of polarization. The sub-beam component having the desired state of polarization will be passed towards the exit surface of the illumination system at the next time when it arrives at the reflective polarizer. The sub-beam component having the unwanted state of polarization remains in the illumination system so as to be converted into light having the desired state of polarization. After a number of reflections on the reflective electrode layer and the reflective polarizer, hence after a number of passages through the active layer, a large part of the light of the original unwanted beam component can also be coupled out at the exit surface of the illumination system via the transparent electrode layer and the reflective polarizer, which light has the desired state of polarization.

If the polarizer is a circular polarizer, the reflective electrode layer will preferably be implemented as a specular reflector. In this case, the state of polarization is inverted on the reflector and the conversion into light of the desired state of polarization is effected more rapidly than in the case where only the birefringence of the active layer ensures the depolarization.

A reflective polarizer has the advantage that substantially no light is absorbed, but that the light originally having the unwanted state of polarization is recuperated so that the greater part can as yet be converted into light having the desired state of polarization.

A first embodiment of the illumination system according to the invention is characterized in that the reflective polarizer is a cholesteric polarizer.

A cholesteric polarizer is a polarizer which comprises a layer of liquid crystalline material with a cholesteric ordering. Such a polarizer is particularly suitable as a reflective polarizer. In this type of liquid crystalline material, the chiral molecules have such a structure that they spontaneously order in solution to a helical or helix-like structure. This helix-like structure can be directed in such a way that the axis of the helix will be transverse to the layer.

When unpolarized light is incident on such a polarizer, the circularly polarized beam component of the light matching the (dextrorotatory or levorotatory) direction of the helix and whose wavelength matches the pitch of the helix will be reflected, whereas the other beam component will be passed.

The reflection bandwidth $\lambda_o$ of a cholesteric layer is given by:

$$\lambda_o = 1/2(n_o + n_e)p$$

in which p is the pitch of the molecular helix and $n_o$ and $n_e$ are the ordinary and extraordinary refractive indices, respectively, of the material of the cholesteric layer. The cholesteric polarizer may comprise a narrow-band cholesteric layer. This means that the layer has a polarizing effect in a limited wavelength range, so that the polarized light will have a color in conformity with this wavelength range.

A further embodiment of the illumination system according to the invention is characterized in that the cholesteric polarizer is implemented as a single layer of liquid crystalline polymer material, within which layer the pitch of the molecular helix varies substantially continuously between two values which correspond to the lower limit and the upper limit, respectively, of the reflection band required to cover the full visible wavelength range.

Since the pitch of the helix varies across the layer, a relatively large reflection bandwidth can be achieved and it is even possible to cover the full visible wavelength range with a single-layer cholesteric polarizer. For the same reflection bandwidth, a single-layer cholesteric polarizer is thinner than a multilayer stack in which each of the layers has a given bandwidth.

A further advantage of a pitch which is variable across the layer of the polarizer is that the reflection bandwidth can be chosen to be so wide that the band shift occurring upon light incidence at a large angle with respect to the normal on the polarizer does not have a great influence on the polarizing effect of the cholesteric layer.

For detailed information relating to the manufacture of a single-layer cholesteric polarizer, reference is made to European Patent Application EP 0 606 940.

A further embodiment of the illumination system according to the invention is characterized in that an n.λ/4 plate is present at the side of the cholesteric polarizer facing away from the transparent electrode.

Since a cholesteric polarizer is a circular polarizer, a polarization converter is to be provided if it is desirable that the illumination system supplies linearly polarized light. An n.λ/4 plate, and particularly a wideband n.λ/4 plate, is very suitable for this purpose. Such a plate is known per se from, for example, the article: "Retardation Film for STN-LCD's 'NRF'" of the firm of Nitto Denko in SID '92 Exhibit Guide, Society for Information Display, May 17–22, 1992, Boston, Mass., USA.

Another embodiment of the illumination system according to the invention is characterized in that the reflective polarizer is a linear polarizer which is constituted by a stack of layers, at least a number of which comprises birefringent material.

In this embodiment, the beam components are linearly polarized and, consequently, an n.λ/4 plate can be dispensed with.

Such a polarizer may be made by means of extrusion in a single step. An example of such a polarizer is described extensively in U.S. Pat. No. 5,217,794.

A further embodiment of the illumination system according to the invention is characterized in that the reflective polarizer and the transparent electrode layer have a common substrate.

Generally, the assembly consisting of the two electrode layers with the active layer in between is provided on a separate optical transparent substrate. If the reflective polarizer is not a self-supporting film and will therefore have to be provided on a separate substrate, one of the substrates can now be dispensed with. As a result, the number of different layers can be reduced.

In practice, the cholesteric polarizer will function as the substrate for the transparent electrode layer and for the assembly consisting of the two electrode layers with the active layer in between.

A further embodiment of the illumination system according to the invention is characterized in that the electroluminescent material is an oriented organic compound which generates polarized light upon energization of the electrode layers.

The provision of a polarizer is not only advantageous if the active layer supplies unpolarized light, but also if the active layer itself supplies already polarized light such as an oriented organic compound, for example, a polymer which is stretched in one direction. In fact, such a material does not have such a high polarization efficiency, so that a much higher light output can be realized by providing such an illumination system also with a polarizer.

A further embodiment of the illumination system according to the invention is characterized in that a λ/4 plate is present between the reflective polarizer and the transparent electrode layer.

Since the light generated by an oriented organic compound is at least partly linearly polarized, an extra n.λ/4 plate is to be arranged between the transparent electrode and the reflective polarizer, if the polarizer is a circular polarizer, so as to convert the linearly polarized light into circularly polarized light.

These and other aspects of the invention will be apparent from and elucidated with reference to the embodiments described hereinafter.

DESCRIPTION OF THE PREFERRED EMBODIMENTS

Figure 1:
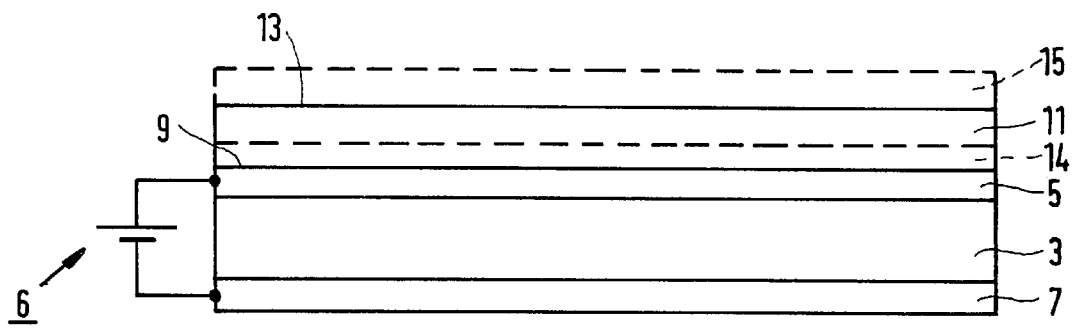
FIG. 1 shows an embodiment of an illumination system according to the invention.

The electroluminescent illumination system 1 shown in FIG. 1 has an optically active layer 3 of electroluminescent material. The layer 3 is surrounded by two electrode layers 5, 7. One of the electrode layers, for example layer 5, is optically transparent. This electrode layer 5 ensures the injection of holes in the layer 3 of active material. It is referred to as the anode. Suitable material for this electrode layer 5 is, for example, indium-tin oxide (ITO) or a transparent electrically conducting polymer layer such as polyaniline (PANI). The other electrode layer 7, referred to as the cathode, is reflective and ensures the injection of electrons in the active layer 3. The cathode consists of, for example calcium, indium, aluminium, barium or magnesium.

If an electric voltage is applied across the two electrode layers 5, 7 by means of a voltage source 6, holes and electrons are injected in the active layer 3, where they will recombine and cause the molecules of this layer to reach a higher energy level. If a molecule then falls back to a lower energy level, this the excess energy is released in the form of light. This process is known as electroluminescence.

There are different possibilities for the material of the active layer 3. The electroluminescent material may be both organic and inorganic material. The use of inorganic materials such as, for example, III–V or II–VI semiconductors or phosphors for the active layer is known per se. Metal chelate complexes such as, for example, 8-hydroxyquinoline aluminium and semiconducting organic polymers such as, for example, poly phenylenevinylene (PPV) are known as organic materials. These materials may function in a single layer or in more layers as an active region. The advantage of polymer LEDs is that the illumination system may be implemented in an extremely thin form, namely, as a film. Moreover, in addition to the transparent and reflective electrode layers 5, 7, extra layers may be provided to raise the electron and hole injection, which enhances the efficiency of the illumination system.

An illumination system as described above supplies unpolarized light. When the system is used in flat-panel picture display devices with a liquid crystalline picture display panel, it is desirable in a large number of cases that the light by which picture information is to be supplied by the picture display panel has already been polarized in advance, because the picture display panel modulates the state of polarization of light incident thereon. This means that the illumination system should preferably supply polarized light. To be able to realize this, the present invention proposes to provide a reflective polarizer 11 at the side 9 of the transparent electrode layer 5 facing away from the active layer 3. When an unpolarized beam is incident on such a polarizer it will be split into two beam components having complementary states of polarization, because one of the beam components will be passed by the polarizer, whereas the other will be reflected. In practice, it will be ensured that the polarizer is adapted in such a way that the beam component having the state of polarization which is desirable for the picture display panel is passed, whereas the beam component having the unwanted state of polarization is reflected back into the illumination system wherein it can again possibly be converted into light having the desired state of polarization.

When an electric field is applied across the active layer 3 by applying an electric voltage across the electrode layers 5, 7, light will be emitted by this layer 3 as a result of electroluminescence. A large part of this light is incident via the transparent electrode 5 on the reflective polarizer 11, so that one beam component is reflected in the planar LED, whereas the other beam component is passed towards the exit surface 13 of the illumination system 1. The beam component having the unwanted state of polarization is sent back towards the reflective electrode layer 7 by the polarizer 11, via the optically active layer 3. In the active layer 3, this beam component will at least partly depolarize due to the birefringence of this layer 3. Consequently, the unwanted beam component falls apart into a sub-beam component having the desired state of polarization and a sub-beam component having the unwanted state of polarization. The sub-beam component having the desired state of polarization will be passed upon arrival at the reflective polarizer and coupled out of the illumination system. The sub-beam component having the unwanted state of polarization will be reflected by the reflective polarizer, at least partly depolarized again in the active layer, etc. Light having the unwanted state of polarization is thus repeatedly reflected between the reflective polarizer 11 and the reflective electrode layer 7 until conversion into light having the desired state of polarization is achieved.

When, for example, the active layer comprises a polymer, for light at a grazing of a incidence the material is sufficiently birefringent to cause depolarization upon a single passage. In fact, it holds for the refractive indices that $n_x = n_y > n_z$, in which the z direction is located perpendicularly to the plane of the active layer 3 (x, y plane). If there is less birefringent material, more than one passage may be necessary to cause depolarization.

The light having the unwanted state of polarization is thus not absorbed but returned back so that it will as yet have another chance of being converted into light having the desired state of polarization.

The reflective polarizer 11 may be implemented in different ways. In a first embodiment, the polarizer 11 comprises a layer of liquid crystalline material having a cholesteric ordering. In this type of liquid crystalline material, the chiral molecules have a structure such that in solution they spontaneously order to a helical or helix-like structure having a pitch p. This helix-like structure can be directed in such a way that the axis of the helix will be transverse to the layer.

When unpolarized light is incident on such a polarizer, the beam component of the light matching the (dextrorotatory or levorotatory) direction of rotation of the helix and whose wavelength matches the pitch p of the helix will be reflected, whereas the other circularly polarized beam component will be passed. The reflection bandwidth $\lambda_0$ of a cholesteric layer is given:

$$\lambda_0 = 1/2(n_o + n_e)p$$

Here, p is the pitch of the molecular helix and $n_o$ and $n_e$ are the ordinary and the extraordinary refractive indices, respectively, of the liquid crystalline material.

The cholesteric polarizer may be composed of a plurality of layers within which the pitch is constant but in which each layer is active in a different wavelength range. The different wavelength ranges may be chosen to be such that all layers combined cover the full visible wavelength range. In this way, it is possible to use the illumination system in a color picture display device, provided that the active layer of the illumination system emits light in the full visible wavelength range.

The cholesteric polarizer preferably consists of a single layer of liquid crystalline material within which the pitch of the molecular helix varies substantially continuously between two values which correspond to the lower limit and the upper limit, respectively, of the reflection band required to cover the full visible wavelength range. In this way, it is sufficient to use a much thinner polarizer than in the case using stacked layers. A further advantage is that a single-layer polarizer has a better optical quality. The quality of cholesteric polarizers decreases with an increasing number of layers, due to errors which are typical of cholesterics. Moreover, the range of angles of incidence of light to be polarized, within which the polarizer is effective, decreases with an increasing thickness. An advantage of a polarizer consisting of a single cholesteric layer is that the bandwidth may be chosen to be so large that the band shift occurring upon light incidence at a large angle with respect to the normal on the polarizer does not have a detrimental influence on the polarizing effect. In fact, upon non-perpendicular incidence on the cholesteric layer, there is an extra birefringence which increases with an increasing angle of incidence.

Another possibility of manufacturing a cholesteric polarizer is to stack a plurality of cholesteric layers, at least a number of which have a pitch varying substantially continuously across the layer thickness. In this way, it is sufficient to use a much smaller number of layers than in the first-mentioned case.

It is to be noted that it is known per se that cholesteric layers are suitable as polarizers. Cholesteric polarizers are known, for example, from the article: "Polarizing Color Filters made from Cholesteric LC Silicones" by R. Maurer et al. in SID International Symposium 1990, Digest of Technical Papers, pp. 110–113.

If the polarizer 11 is a circular polarizer, the reflective electrode layer 7 is preferably implemented as a specular reflector. A circular state of polarization is inverted thereby, so that the conversion into light having the desired state of polarization can be effected more rapidly than in the case where single depolarization occurs as a result of birefringence of the material of the active layer.

If the polarizer 11 is a circular polarizer and if linearly polarized light is desired, the illumination system 1 may be provided with an n.λ/4 plate 15 for converting the light which is circularly polarized by the polarizer 11 into linearly polarized light. The n.λ/4 plate 15 is preferably provided on the exit surface 13 of the illumination system 1. The n.λ4 plate may be wavelength-sensitive but preferably has a wide band. In this case, color pictures can be displayed, provided that the polarizer 11 is also active in the full visible wavelength range and the active layer emits light in this wavelength range. Such an n.λ/4 plate is known from, for example, the article: "Retardation Film for STN-LCD's 'NRF'" of the firm of Nitto Denko in SID '92 Exhibit Guide, Society for Information Display, May 17–22, 1992, Boston, Mass., USA.

The cholesteric layer may be a self-supporting film. If this is not the case, this layer should be provided on a substrate. If the active layer 3 is a polymer film, the LEI) is generally also provided on a substrate, for example, a glass or a synthetic material plate. By providing the LED 3, 5, 7 and the polarizer 11 at each side of the same substrate, the second substrate may be dispensed with so that the number of different layers is limited.

The reflective polarizer may alternatively be implemented as a linear polarizer comprising a stack of birefringent layers or a stack of layers being alternately birefringent and non-birefringent. Such a polarizer may be made in a single step by means of extrusion, an example of which is described in U.S. Pat. No. 5,217,794. In this case, the n.λ/4 plate may be dispensed with.

It is known in the art for example, from international Patent Application WO 92/16023, that the polymer may be stretched in one direction if the active layer of the planar LED is a polymer film, so that the emitted light is already polarized. Since its polarization efficiency is relatively low, it is advantageous to provide a reflective polarizer also in an illumination system in which the active layer is formed by such a polymer.

The polarized light supplied by such a LED is linearly polarized. If the polarizer 11 is a circular polarizer, an extra n.λ/4 plate 14 is to be arranged between the transparent electrode layer 5 and the polarizer 11 in order that this light can reach the exit surface 13 of the illumination system 1. The light emitted by the LED then passes through the electrode layer 5 towards the λ/4 plate 14. Here, the linearly polarized light is converted into circularly polarized light. The desired beam component is passed by the reflective polarizer 11 and subsequently converted again into linearly polarized light by the λ/4 plate 15, if linearly polarized light is desired.

The n.λ/4 plate 15 is required if the reflective polarizer 11 is a circular polarizer and if the illumination system 1 is to supply linearly polarized light, irrespective of whether the active layer 3 supplies at least partly linearly polarized light or unpolarized light. The n.λ/4 plate 14 is required if the active layer 3 itself already supplies partly linearly polarized light and if the reflective polarizer 11 is a circular polarizer. Since both λ/4 plates 14, 15 are only required in given cases, they are shown by way of broken lines in the Figures.

Figure 2:
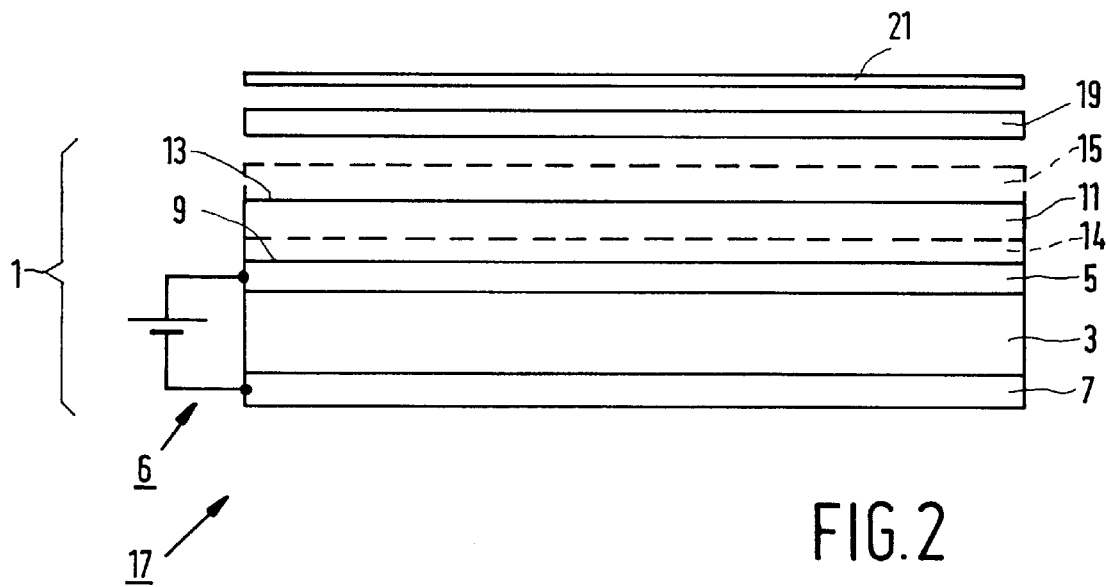
FIG. 2 shows an embodiment of a flat-panel picture display device provided with an illumination system according to the invention.

FIG. 2 shows an embodiment of a flat-panel picture display device 17 which is provided with an illumination system according to the invention. The polarized light supplied by the illumination system 1 is incident on a picture display panel 19 which will modulate the state of polarization of the incident light with picture information. The picture display panel 19 may comprise, for example, a liquid crystalline material and may be provided with a matrix of pixels whose operation is based on the twisted-nematic (TN), the super twisted-nematic (STN) or the ferro-electric effect for modulating the polarization direction.

The modulated light is subsequently incident on an analyzer 21 before it reaches the viewer 23. The analyzer 21 ensures that light from certain of the pixels in the picture display panel, which pixels must be dark in the ultimate picture, is obstructed.

By using an illumination system according to the invention, a very flat picture display device having a relatively high brightness is obtained, because substantially all the light emitted by active layer is utilized for the formation of the picture.

We claim:
1. A polarized light illumination system, comprising:
an active layer of electroluminescent material included between first and second electrode layers;
the first electrode layer being reflective of light incident thereon, and the second electrode layer being transparent to light incident thereon;
a reflective polarization layer adjacent a side of the second electrode layer facing away from the active layer, said polarization layer being selectively transparent to a desired polarization component of light incident thereon and reflective of other components of the incident light; and
means for enhancing brightness in said illumination system, comprising said desired polarization component of light from said active layer incident on said polarization layer being transmitted thereby and other components of the incident light being reflected back to said active layer, the reflected light being at least partially converted by said active layer to light having said desired polarization component, and the partially converted light being returned to said reflective polarizer for repetition of selection of said desired polarization component therefrom and reflection of other components thereof back to said active layer.

2. An illumination system as claimed in claim 1, characterized in that the reflective polarizer is a cholesteric polarizer.

3. An illumination system as claimed in claim 2, characterized in that the cholesteric polarizer is implemented as a single layer of liquid crystalline polymer material, within which layer the pitch of the molecular helix varies substantially continuously between two values which correspond to the lower limit and the upper limit, respectively, of the reflection band required to cover the full visible wavelength range.

4. An illumination system as claimed in claim 3, characterized in that an n.$\lambda$/4 plate is present at the side of the cholesteric polarizer facing away from the transparent electrode.

5. An illumination system as claimed in claim 1, characterized in that the reflective polarizer is a linear polarizer which is constituted by a stack of layers, at least a number of which comprises birefringent material.

6. An illumination system as claimed in claim 1, characterized in that the reflective polarizer and the transparent electrode layer have a common substrate.

7. An illumination system as claimed in claim 1, characterized in that the electroluminescent material is an oriented organic compound which generates polarized light upon energization of the electrode layers.

8. An illumination system as claimed in claim 7, in which the reflective polarizer is a circular polarizer, characterized in that a $\lambda$/4 plate is present between the reflective polarizer and the transparent electrode layer.

9. A flat-panel picture display device comprising an illumination system for supplying a polarized light beam, and a picture display panel for modulating the state of polarization of the light beam supplied by the illumination system in conformity with picture information to be displayed, characterized in that the illumination system is an illumination system as claimed in claim 1.

10. An illumination system as claimed in claim 2, characterized in that an n.$\lambda$/4 plate is present at the side of the cholesteric polarizer facing away from the transparent electrode.

11. An illumination system as claimed in claim 2, characterized in that the reflective polarizer and the transparent electrode layer have a common substrate.

12. An illumination system as claimed in claim 3, characterized in that the reflective polarizer and the transparent electrode layer have a common substrate.

13. An illumination system as claimed in claim 4, characterized in that the reflective polarizer and the transparent electrode layer have a common substrate.

14. An illumination system as claimed in claim 5, characterized in that the reflective polarizer and the transparent electrode layer have a common substrate.

15. A flat-panel picture display device comprising an illumination system for supplying a polarized light beam, and a picture display panel for modulating the state of polarization of the light beam supplied by the illumination system in conformity with picture information to be displayed, characterized in that the illumination system is an illumination system as claimed in claim 2.

* * * * *